US009343600B2

(12) United States Patent
Zhang et al.

(10) Patent No.: US 9,343,600 B2
(45) Date of Patent: May 17, 2016

(54) INTEGRATED MICROINVERTER HOUSING FOR A PV AC MODULE

(71) Applicants: Haibo Zhang, Kingston (CA); Jan Dressel, Kingston (CA); Praveen Jain, Kingston (CA); Majid Pahlevaninezhad, Kingston (CA); Shangzhi Pan, Kingston (CA)

(72) Inventors: Haibo Zhang, Kingston (CA); Jan Dressel, Kingston (CA); Praveen Jain, Kingston (CA); Majid Pahlevaninezhad, Kingston (CA); Shangzhi Pan, Kingston (CA)

( * ) Notice: Subject to any disclaimer, the term of this patent is extended or adjusted under 35 U.S.C. 154(b) by 27 days.

(21) Appl. No.: 14/562,128

(22) Filed: Dec. 5, 2014

(65) Prior Publication Data

US 2015/0163949 A1    Jun. 11, 2015

Related U.S. Application Data

(60) Provisional application No. 61/912,950, filed on Dec. 6, 2013.

(51) Int. Cl.
*H05K 7/20* (2006.01)
*H01L 31/024* (2014.01)
*H02J 3/38* (2006.01)
*H02S 40/34* (2014.01)
*H02S 40/32* (2014.01)
*H02S 40/42* (2014.01)

(52) U.S. Cl.
CPC .............. *H01L 31/024* (2013.01); *H02J 3/383* (2013.01); *H02S 40/32* (2014.12); *H02S 40/34* (2014.12); *H02S 40/425* (2014.12); *Y02E 10/50* (2013.01)

(58) Field of Classification Search
CPC ......... H05K 7/14; H05K 7/20; H05K 7/2039; H05K 4/2089; H05K 7/20145; H05K 5/0247; H05K 5/03; H01L 31/042; H01L 31/02021; H01L 31/052; H01L 31/02008
See application file for complete search history.

(56) References Cited

U.S. PATENT DOCUMENTS

| 6,111,189 | A  | * | 8/2000  | Garvison ............... F24J 2/5211 126/621 |
| 8,455,752 | B2 |   | 6/2013  | Korman et al. |
| 8,462,518 | B2 | * | 6/2013  | Marroquin ............... H05K 7/10 136/243 |
| 8,929,094 | B2 | * | 1/2015  | Marroquin ............... H05K 7/10 136/244 |
| 2008/0285317 | A1 |   | 11/2008 | Rotzoll |
| 2010/0078058 | A1 | * | 4/2010  | Nightingale ...... H01L 31/02021 136/244 |
| 2011/0083733 | A1 | * | 4/2011  | Marroquin ............... H05K 7/10 136/256 |
| 2012/0042588 | A1 |   | 2/2012  | Erickson, Jr. |
| 2012/0255596 | A1 | * | 10/2012 | Korman .................. F24J 2/5207 136/251 |
| 2014/0182651 | A1 |   | 7/2014  | Rogerson et al. |
| 2015/0101653 | A1 | * | 4/2015  | Cioffi ....................... H02S 20/00 136/251 |

FOREIGN PATENT DOCUMENTS

EP          2413382  A2    2/2012

* cited by examiner

*Primary Examiner* — Gregory Thompson
(74) *Attorney, Agent, or Firm* — Brion Raffoul

(57) ABSTRACT

Systems and devices relating to an integrated housing for microinverters. The housing has a cavity for housing the circuitry of the microinverter. The housing is mountable on a back sheet of a PV module by way of the housing's top cover. An opening at the back of the housing accommodates DC contacts coming from the PV module while a void configured for an output port is also present in the housing. When mounted on the PV module, the housing is spaced apart from the module.

12 Claims, 10 Drawing Sheets

US 9,343,600 B2

INTEGRATED MICROINVERTER HOUSING FOR A PV AC MODULE

RELATED APPLICATIONS

This application is a non-provisional application which claims the benefit of U.S. Provisional Patent Application No. 6/912,950 filed on Dec. 6, 2013.

TECHNICAL FIELD

The present invention relates to microinverters. More specifically, the present invention relates to housings for microinverters that address the issue of untidy cabling and input and output ports.

BACKGROUND OF THE INVENTION

There is a growing number of photovoltaic (PV) applications where individual direct current/alternating current (DC/AC) inverters are required for each PV module to effectively harvest maximum solar energy and feed clean AC electricity into the power grid. FIG. 1 is a diagram that illustrates the prior art approach to achieving the requirements of such applications. In this prior art approach, a DC junction box is attached at the back-sheet of the PV module. The junction box accepts the DC voltage from the PV cells, provides the necessary protection, and brings out two DC cables with two DC connectors, one each for a positive voltage and a negative voltage. The DC cables are connected to a micro-inverter to produce an AC voltage at its output which is fed to the AC grid via an AC connector.

For greater clarity, FIG. 2 is provided. FIG. 2 shows the schematic of the DC junction box and how it is connected to the PV panel and the micro-inverter. According to FIG. 2, the PV panel 1 is connected to the DC junction box 2. The DC junction box 2 is connected to the micro-inverter 3, and the micro-inverter 3 is connected to the utility grid 4. The DC junction box 2 usually includes a diode 21, a fuse 22, a circuit breaker 23, and an antiparallel diode 24. The diode 21, the fuse 22, and the circuit breaker 23 are conducting the output current of the PV panel. These components contribute to the overall losses of the power conditioning system. Also, these components increase the cost of the power conditioning systems. Therefore, the main drawbacks of this approach are higher cost and longer installation time.

It should be clear that the arrangement in FIG. 2 has drawbacks. The arrangement in FIG. 1 is, unfortunately, also less than desirable. The cables connecting the microinverter to the junction box are exposed to the elements and, as such, are vulnerable to the ravages of cold, heat, and wind. As well, if repair work is to be done on the PV module or on any of the components of the PV system, these loose cables are susceptible to snagging by repair and maintenance personnel. Also, the presence of both AC and DC connectors and the presence of the junction box itself not only can be confusing but may also complicate the installation of PV systems.

Based on the above, there is therefore a need for systems and methods which avoid or mitigate the shortcomings of the prior art.

SUMMARY OF INVENTION

The present invention provides systems and devices relating to a housing for microinverters. The housing has a cavity for housing the circuitry of the microinverter. The housing is mountable on a back sheet of a PV module by way of the housing's top cover. An opening at the back of the housing accommodates DC contacts coming from the PV module while a void configured for an output port is also present in the housing. When mounted on the PV module, the housing is spaced apart from the module.

In a first aspect, the present invention provides a housing for use with inverter circuitry for photovoltaic (PV) applications, the housing comprising:
  a main compartment, said main compartment having:
    a cavity for containing said inverter circuitry;
    a void for receiving input contacts, said input contacts being for coupling said circuitry with a PV module to receive DC power from said PV module;
    an output void for an output coupling port, said output coupling port being for coupling said circuitry to provide AC power to circuitry external to said housing;
  a top plate for covering said cavity and for mounting said housing on a frame of said PV module;
wherein
  when said housing is mounted on a frame of said PV module, at least a portion of a bottom of said housing is spaced apart from a back-sheet of said PV module, said housing being in contact with said PV module at DC terminals of said PV module.

BRIEF DESCRIPTION OF THE DRAWINGS

The embodiments of the present invention will now be described by reference to the following figures, in which identical reference numerals in different figures indicate identical elements and in which.

DETAILED DESCRIPTION

Figure 1:
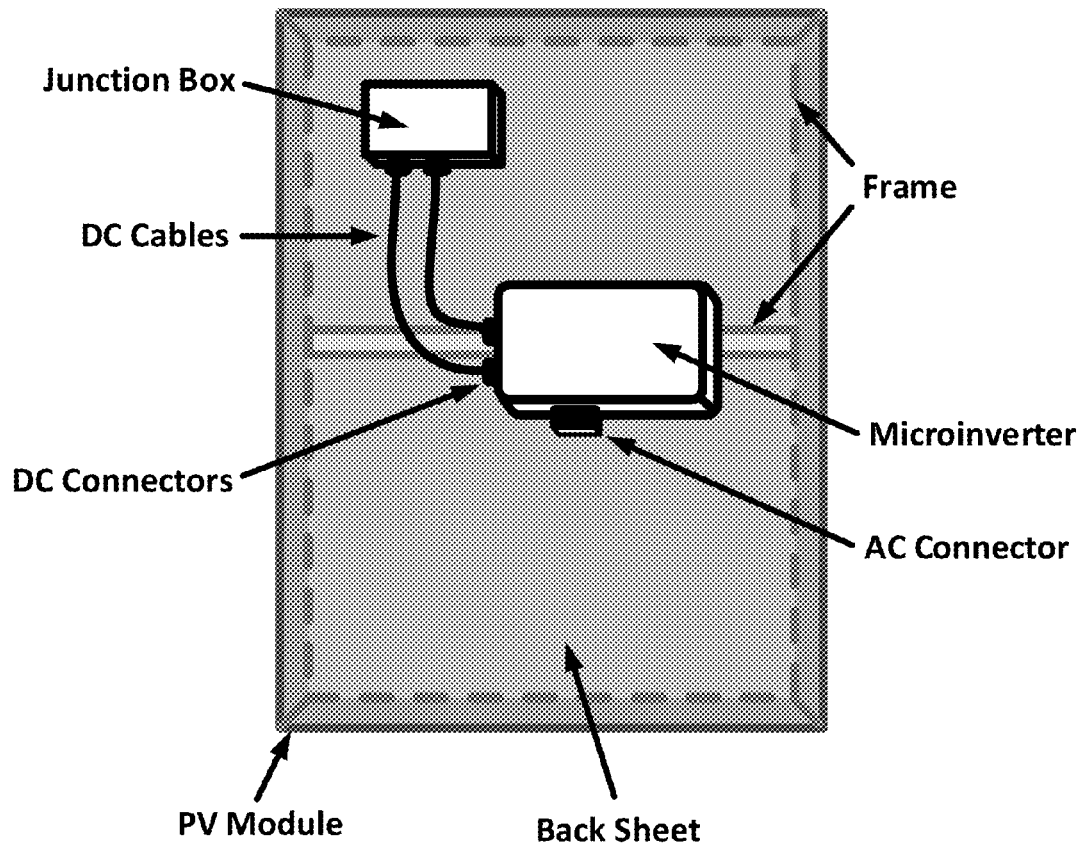
FIG. 1 is a diagram of a prior art configuration.
Figure 2:
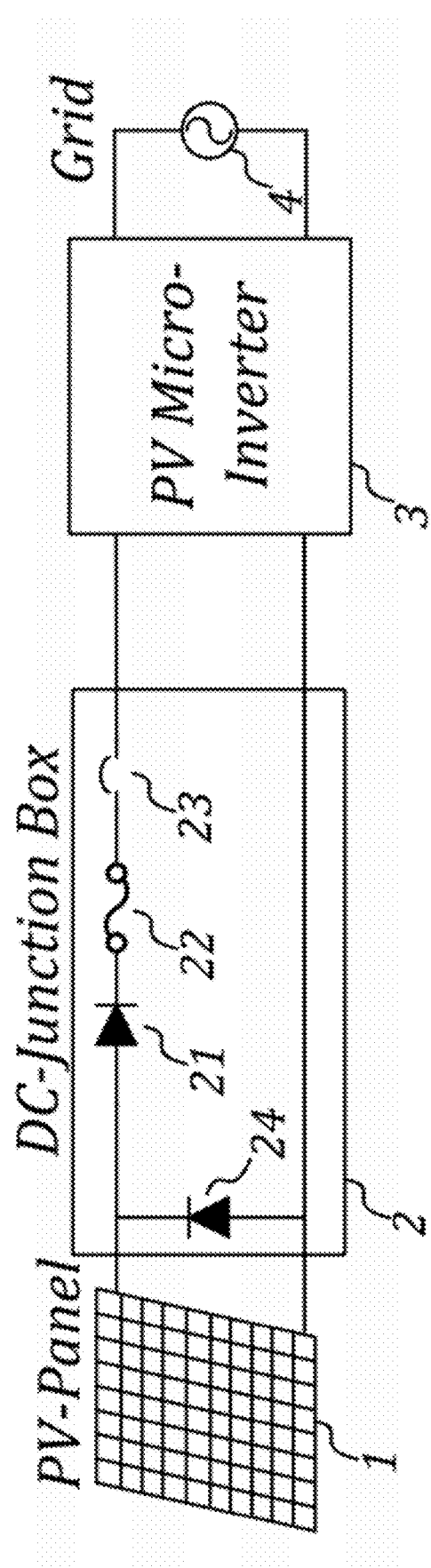
FIG. 2 is a block diagram of a system according to the prior art.
Figure 3:
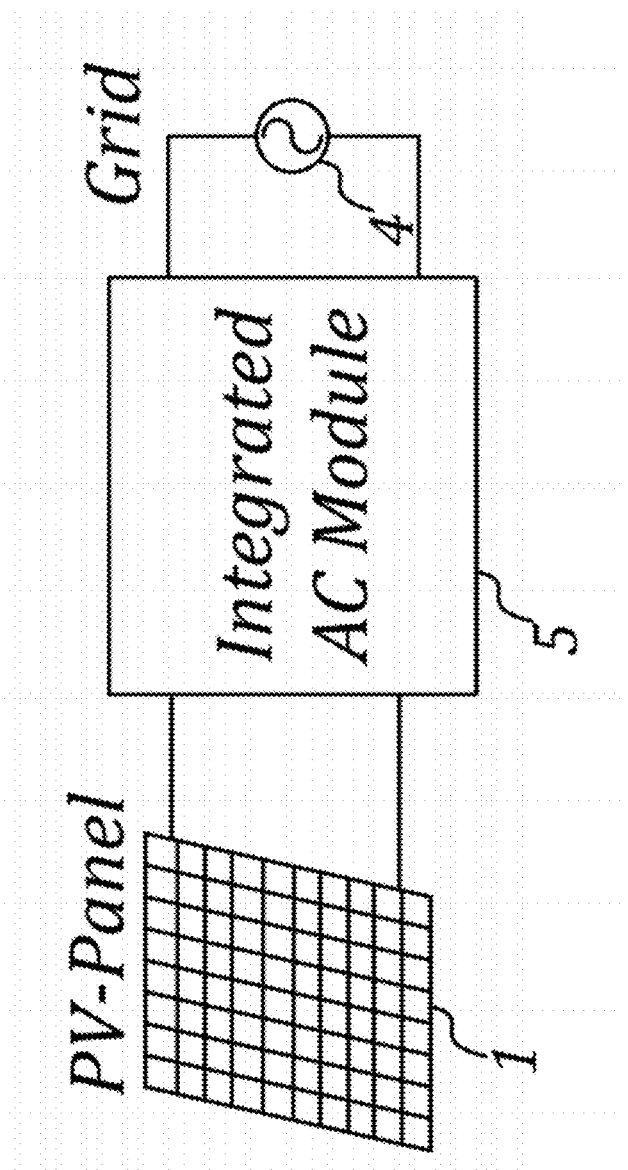
FIG. 3 is a block diagram of one aspect of the invention.

Referring to FIG. 3, a block diagram of a system incorporating one aspect of the invention is illustrated. In the system of FIG. 3, the DC junction box, DC cables and DC connectors are eliminated. The system has a PV panel coupled to an integrated AC module 5 which, in turn, feeds AC power to a power grid. A single micro-inverter unit 5 takes the DC input directly from the PV panel 1 and produces AC electricity to feed to the AC power grid 4.

Figure 4:
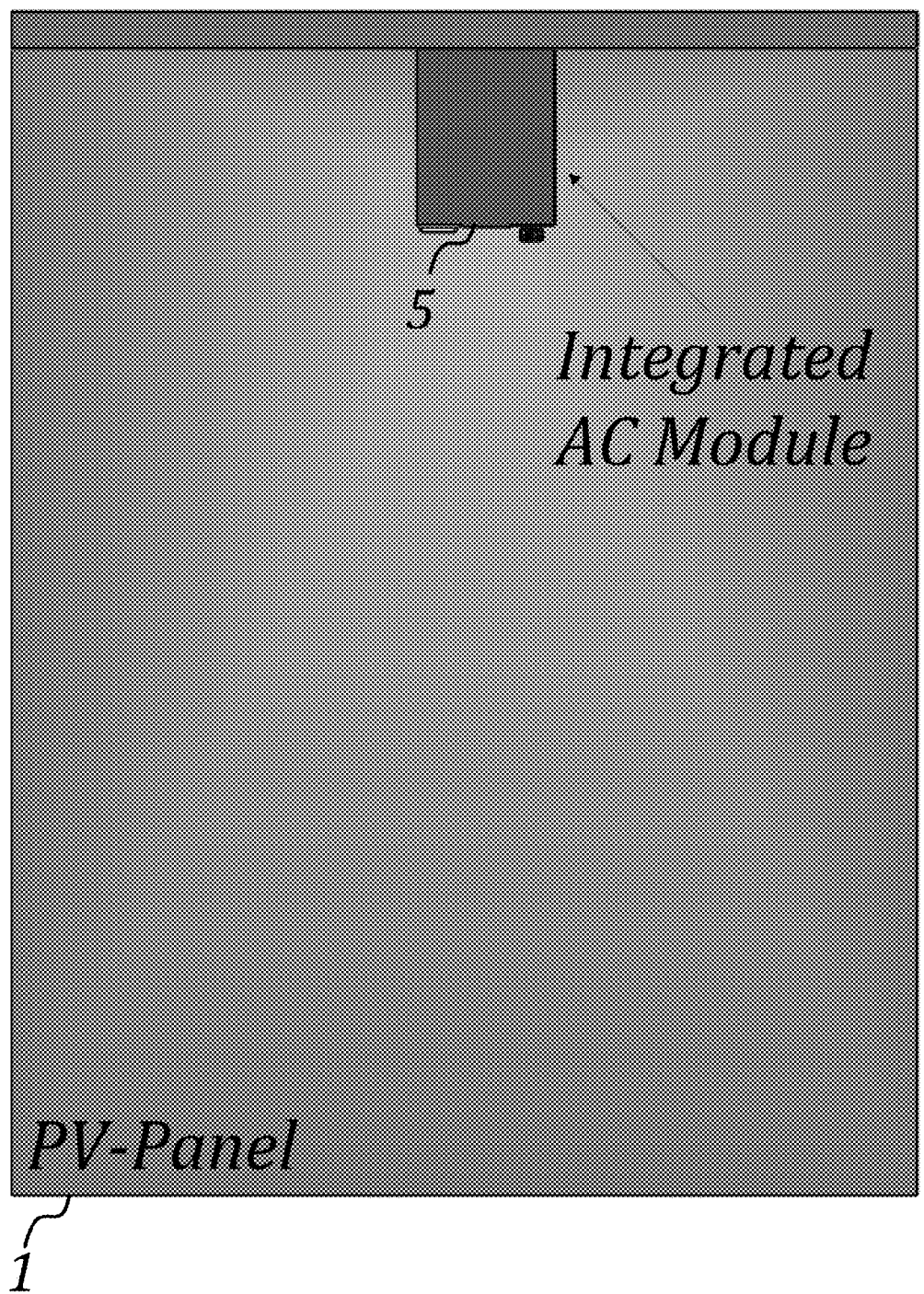
FIG. 4 illustrates one implementation of the invention deployed on a PV panel.

FIG. 4 illustrates a housing containing an integrated module 5 with the housing deployed on a PV panel 1. The integrated AC module 5, is directly connected to the DC wires which originate with the PV panel, 1. The housing containing the integrated AC module 5, has a top plate, 51, and a main compartment 52. A view of the housing with the top plate removed is provided in FIG. 5A. As can be seen from FIG. 5A, the main compartment 52 has a cavity 52A where the main inverter circuitry can be deployed or positioned. A void 52B is also provided to accommodate DC cabling and/or DC contacts from the PV panel. An output void 52C is also provided to accommodate an output port. As can be imagined, the output port 52C couples to an AC cable to feed AC power from the microinverter to the grid or further circuitry.

Figure 5:
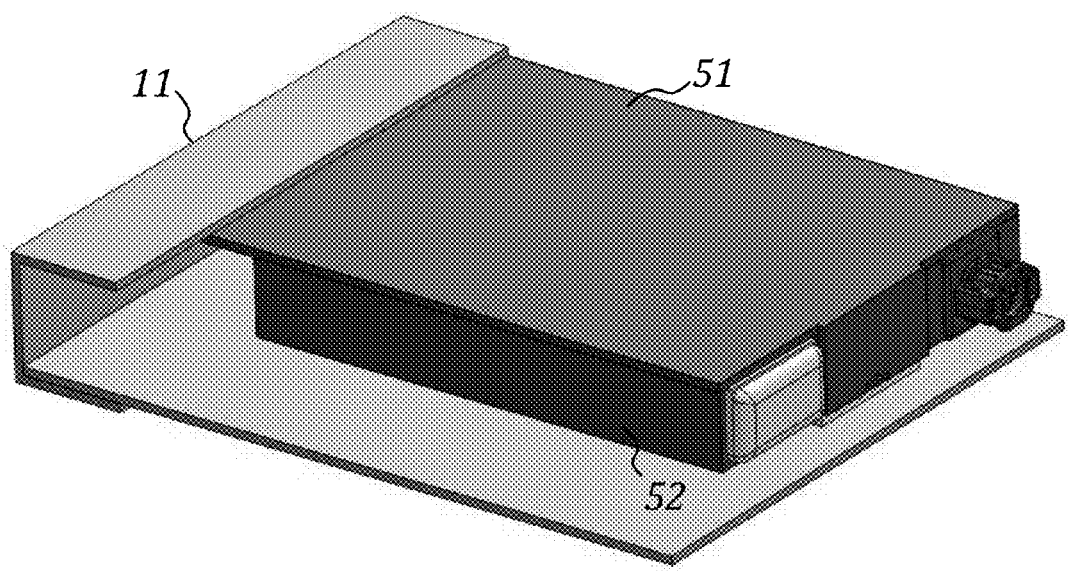
FIG. 5 is an isometric view of one aspect of the invention illustrating how one aspect of the invention is mounted to a PV frame.
Figure 5A:
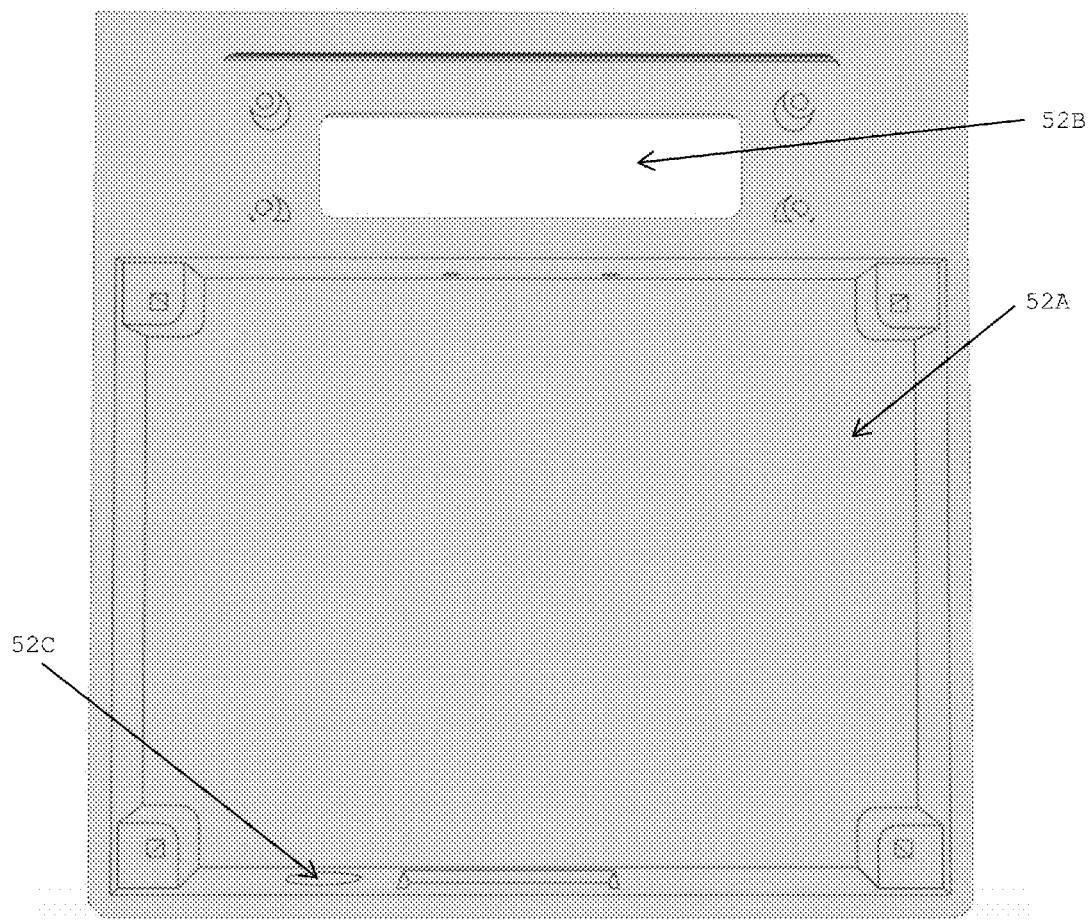
FIG. 5A illustrates the housing according to one aspect of the invention with the top cover removed.

The top plate of the housing is preferably a metal plate made of a thermally conductive material such as aluminum, copper, iron and/or steel and/or an alloy. The top plate can serve as a heat-sink for the microinverter circuitry and/or a grounding connection to the frame for the PV module. The top plate 51 of the housing is attached to the frame 11 of the PV module, in order to support the weight of the housing and the microinverter circuitry, as illustrated in FIG. 5. It should be noted that, in some implementations, the top plate is constructed from plastic material or a plastic composite material. In other implementations, at least a portion of the top plate may be constructed from a thermally conductive material while other portions may be constructed from plastic or plastic composite materials.

Figure 6:
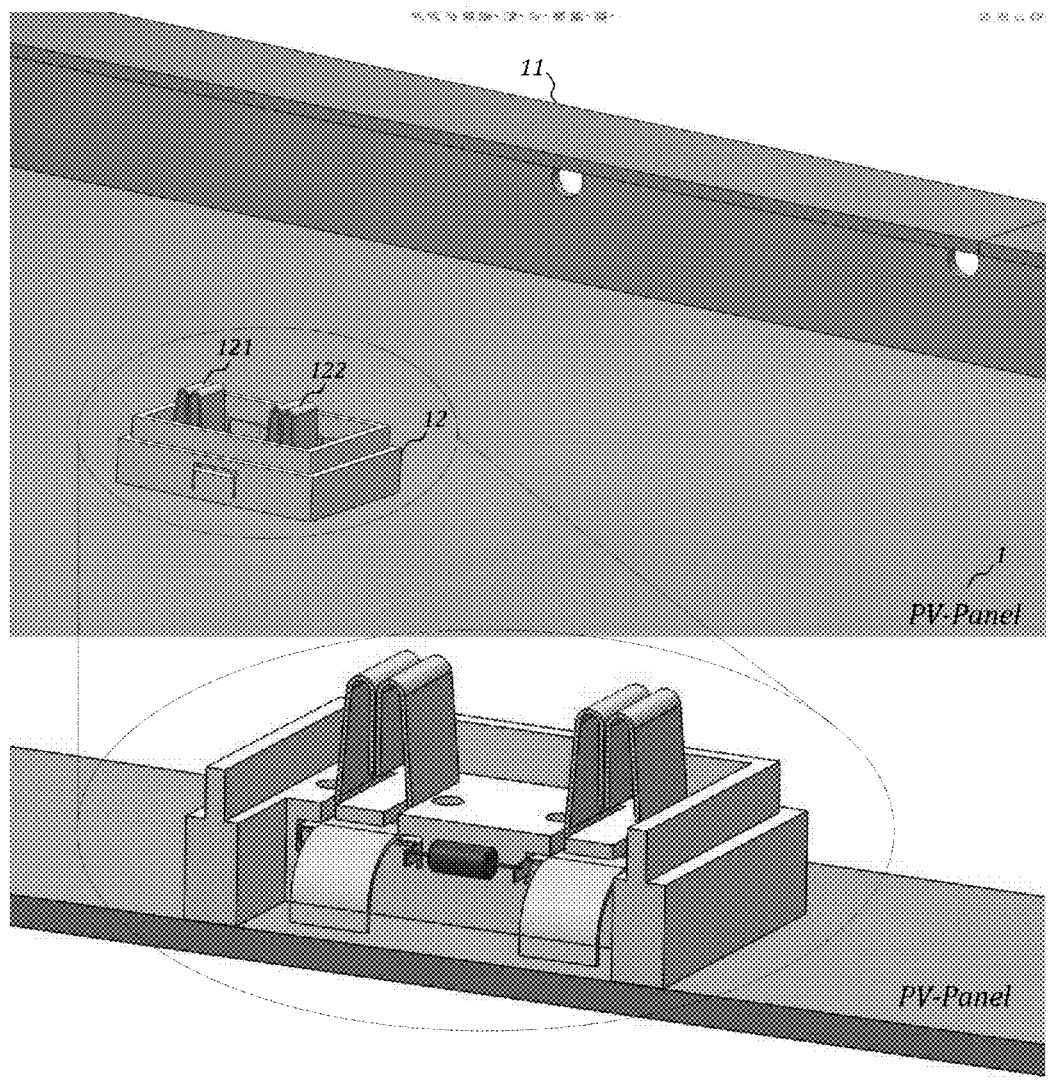
FIG. 6 illustrates a socket for use with one aspect of the invention.

FIG. 6 is a diagram illustrating how the positive and negative DC contacts originate from the PV panel, 1. The PV panel, 1, has a socket, 12. The positive contact, 121, and the negative contact, 122, come out of the PV panel, 1, through the socket, 12. The positive contact, 121, and the negative contact, 122, is for coupling with a corresponding contact on the integrated AC module 5 within the housing. As can be seen from FIG. 7, the contacts and/or the socket are accommodated by the void 52B. Of course, as an alternative, DC cabling can be coupled to the contacts and the cabling can be passed through the void 52B.

Figure 7:
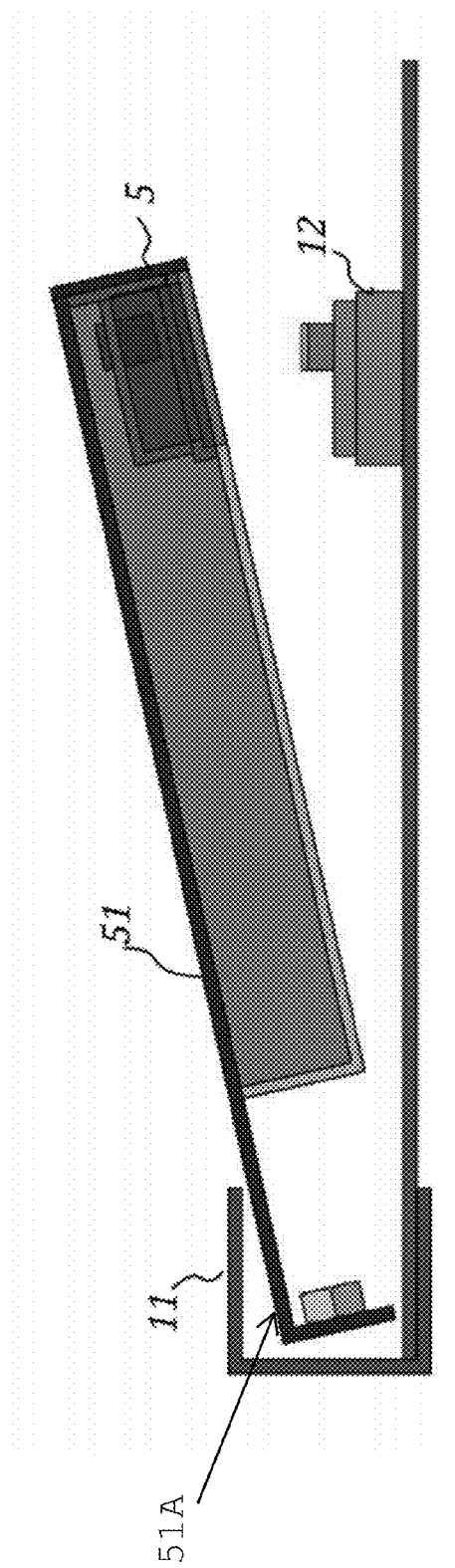
FIGS. 7-9 illustrate the different stages when installing one aspect of the invention to a PV panel.
Figure 8:
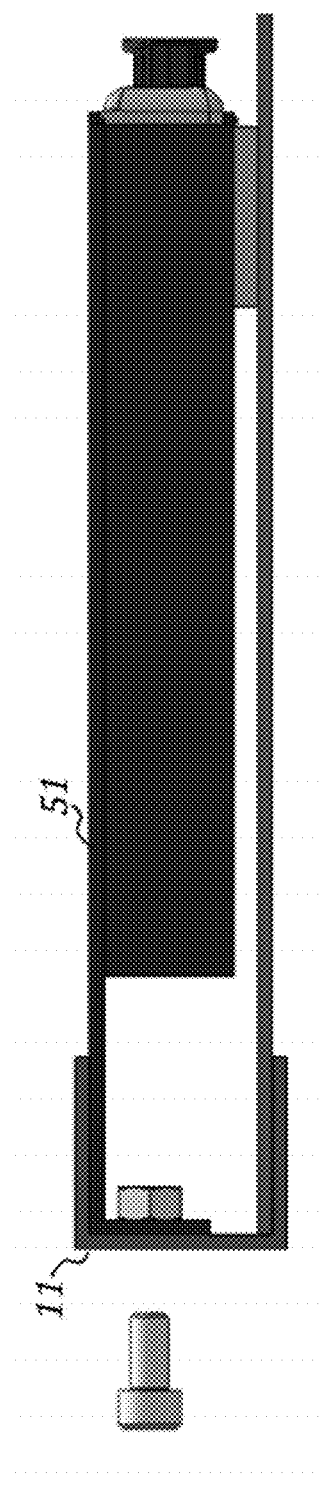
Figure 9:
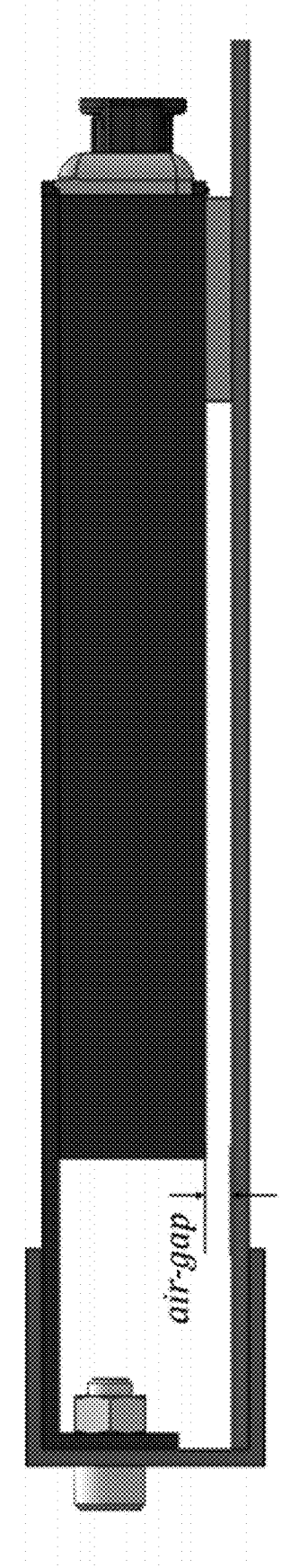

FIG. 7, FIG. 8, and FIG. 9 show the steps for installing the housing containing integrated AC module, 5, on the PV panel, 1. FIG. 7 shows the first step of the installation. In this step, the bracket 51A, which is either attached to the top plate or is incorporated with the top plate 51, is angled to accommodate the frame 11. FIG. 8 shows the second step of the installation. In FIG. 8, the socket 12 and/or the contacts 121, 122 are seated inside the housing and these contacts are coupled to the integrated AC module 5. In the step in FIG. 8, the bracket 51A is about to be secured to the frame 11. In FIG. 9, the housing containing the integrated AC module is secured to the frame. As can be seen, the housing is in a spaced apart relationship with the PV module. An air gap exists between the back sheet of the PV module and the housing. The housing may rest on the socket 12 to assist in keeping the air gap present. FIG. 7, FIG. 8, and FIG. 9 illustrate how the weight of the integrated AC module, 5, is supported by the PV panel frame, 11, perhaps by way of the socket 12.

FIG. 9 shows how an air-gap between the PV panel, 1, and the housing containing integrated AC module, 5, is present when the housing is deployed on the frame 11. As noted above, the area 52 on the back of the housing, has an opening to bring the DC connections from the PV panel to the AC module 5. The small portion of the back 52 of the housing, has a greater thickness than the rest of the housing. This configuration of the housing results in minimal contact between the housing and the PV panel, 1. This minimal contact helps in maintaining a thermal barrier between the PV module and the housing containing the integrated AC module. This also helps in providing air for the cooling of both the PV module and the microinverter.

Figure 10:
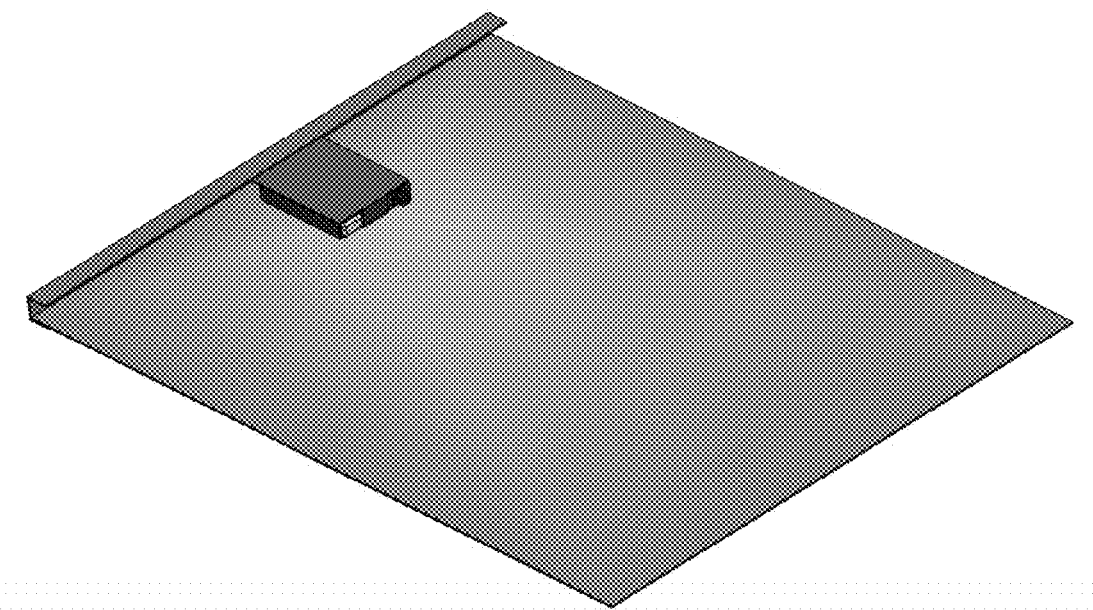
FIG. 10 illustrates one aspect of the invention as installed on a PV module.

FIG. 10 shows an assembled integrated AC module on a PV panel. As can be seen from the Figures, the assembled integrated AC module can be installed using bolts and screws. Because of this, depending on the installation, the module can be uninstalled quickly by simply undoing at least one screw or one bolt. If the installation involved both screws and bolts, the module may be uninstalled by undoing these bolts and screws.

A person understanding this invention may now conceive of alternative structures and embodiments or variations of the above all of which are intended to fall within the scope of the invention as defined in the claims that follow.

We claim:

1. A housing for use with inverter circuitry for photovoltaic (PV) applications, the housing comprising:
    a main compartment, said main compartment having:
    a cavity for containing said inverter circuitry;
    a void for receiving input contacts, said input contacts being for coupling said circuitry with a PV module to receive DC power from said PV module;
    an output void for an output coupling port, said output coupling port being for coupling said circuitry to provide AC power to circuitry external to said housing;
    a top plate for covering said cavity and for mounting said housing on a frame of said PV module;
wherein
    when said housing is mounted on a said frame of said PV module, at least a portion of a bottom of said housing is spaced apart from a back-sheet of said PV module, said housing being in contact with said PV module at DC terminals of said PV module.

2. A housing according to claim 1 wherein said top plate operates as a heat sink for said inverter circuitry.

3. A housing according to claim 1 wherein said top plate comprises a mounting bracket for mounting said housing to said PV module.

4. A housing according to claim 3 wherein said mounting bracket is adjacent a first side of said housing and said output void is at a second side of said housing, said second side being opposite said first side.

5. A housing according to claim 1 wherein all connections and contacts for DC power are contained within said housing.

6. A housing according to claim 2 wherein said top plate is constructed from at least one of aluminum, copper, iron, steel, and an alloy.

7. A housing according to claim 2 wherein said top plate is constructed from at least one of plastic and a plastic composite.

8. A housing according to claim 2 wherein at least a portion of said top plate is constructed from at least one of aluminum, copper, iron, steel and an alloy and at least another portion of said top plate is constructed from at least one of plastic and a plastic composite.

9. A housing according to claim 1 wherein said top place operates as a grounding connection for said PV module.

10. A housing according to claim 1 wherein said void is opposite said top plate.

11. A housing according to claim 1 wherein said housing forms an integrated AC module.

12. A housing according to claim 1 wherein the said housing can be uninstalled by removing at least one of a screw and a bolt from a mounting bracket.

* * * * *